United States Patent [19]

Kusui

[11] Patent Number: 5,335,145
[45] Date of Patent: Aug. 2, 1994

[54] IC CARD AND METHOD OF MANUFACTURING THE SAME

[75] Inventor: Masaaki Kusui, Itami, Japan

[73] Assignee: Mitsubishi Denki Kabushiki Kaisha, Tokyo, Japan

[21] Appl. No.: 74,535

[22] Filed: Jun. 11, 1993

[30] Foreign Application Priority Data

Jun. 16, 1992 [JP] Japan .................................. 4-156311

[51] Int. Cl.⁵ ............................................. H05K 1/14
[52] U.S. Cl. ................................. 361/737; 361/749; 361/770; 361/785; 361/792; 174/261; 439/77
[58] Field of Search ............... 361/728, 736, 737, 748, 361/749, 770, 784, 785, 787, 792, 813, 807; 439/67, 77; 174/52.4, 255, 261; 257/666, 686

[56] References Cited

U.S. PATENT DOCUMENTS 3,766,439 10/1973 Isaacson ............................... 317/100
4,905,124 2/1990 Banjo et al. ............................ 361/395

FOREIGN PATENT DOCUMENTS 2243493 10/1991 United Kingdom .
2248973 4/1992 United Kingdom .

*Primary Examiner*—Leo P. Picard
*Assistant Examiner*—Young Whang
*Attorney, Agent, or Firm*—Leydig, Voit & Mayer

[57] ABSTRACT

An IC card exhibiting improved electrical insulation, heat radiation capability, and radiation noise resistance includes circuit boards stacked in two layers and spaced apart from each other and surface panels of the IC card while maintaining satisfactory mechanical strength in the card. Board supporting portions extending in a frame portion of a main frame and sub-frames disposed on the board supporting portions hold the circuit boards, maintain a predetermined interval between the two circuit boards and between each circuit board and the surface panels, and provide the desired mechanical strength for the card.

6 Claims, 7 Drawing Sheets

IC CARD AND METHOD OF MANUFACTURING THE SAME

BACKGROUND OF THE INVENTION

1. Field of the Invention

This invention relates to an IC card including a circuit board on which parts are mounted and to a method of manufacturing the IC card.

2. Description of the Related Art

Figure 10:
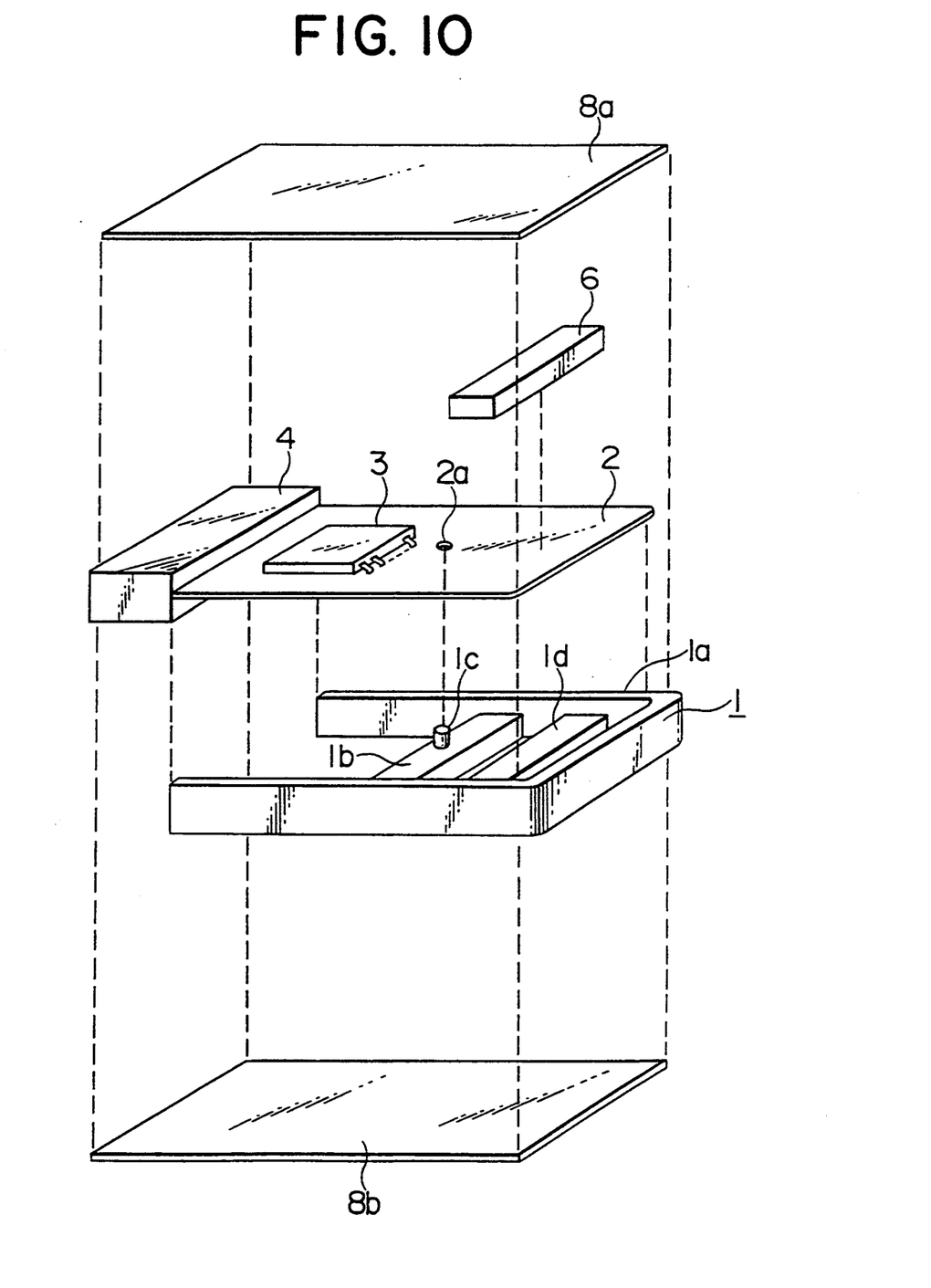
FIG. 10 is an exploded view which illustrate a conventional method of manufacturing an IC card.

FIG. 10 is an exploded view which illustrates a method of assembling a conventional IC card. A main frame 1 comprises a U-shaped frame portion 1a for forming a frame of the card together with a connector 4 to be described later and board supporting portions 1b and 1d, each of which is integrally formed with the frame portion 1a. The board supporting portion 1b has a projecting portion 1c formed at the central portion thereof. A circuit board 2 has circuit patterns (omitted from illustration) or both sides thereof. An IC package 3, which is a function part, is mounted on the circuit board 2 so that an electrical connection is established between them. A connector 4 is connected to either side of the circuit board 2, while a board fixing hole 2a is formed in the central portion of the circuit board to receive the projecting portion 1c of the board supporting portion 1b. The connector 4 constitutes a portion of the frame of the card, the connector 4 being electrically connected to external equipment (omitted from illustration) to which the IC package 3 and the IC card are connected. A surface panel 8a and a reverse panel 8b are protection panels made of metal plates or the like. A sub-frame 6 is disposed between the surface panel 8a and the circuit board 2 as a spacer. Since FIG. 10 is a schematic view which illustrates the IC card, some portions are omitted or schematically illustrated.

Figure 11A:
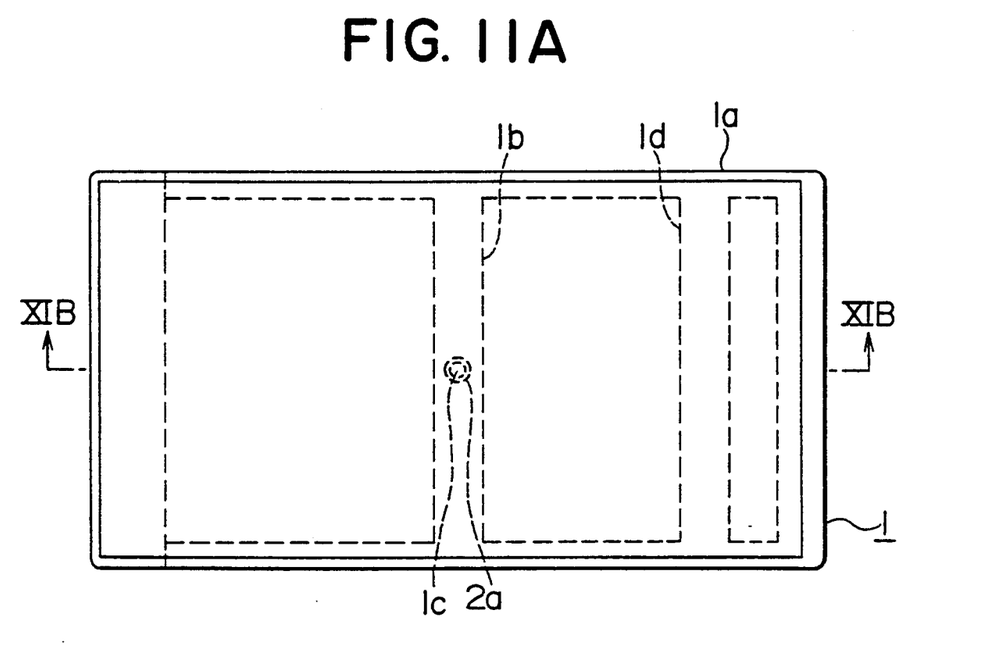
FIG. 11A is a plan view which illustrates a conventional IC card.
Figure 11B:
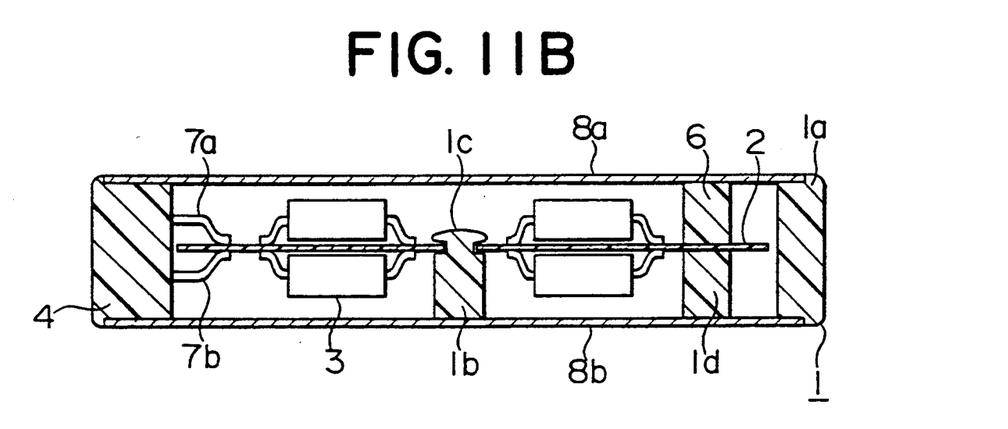
FIG. 11B is a cross sectional view taken along line XIB—XIB.

The structure of a conventional IC card is illustrated further in detail in FIGS. 11A and 11B. FIG. 11A is a plan view which illustrates the structure of the main frame 1. FIG. 11B is a cross sectional view taken along line XIB—XIB of FIG. 11A. Referring to FIGS. 11A and 11B, reference numeral 1d represents a board supporting portion formed at a position opposing the connector 4 of the frame portion 1a, the board supporting portion 1d being formed integrally with the frame portion 1a similarly to the board supporting portion 1b. Reference numerals 7a and 7b represent connector leads for establishing electrical and mechanical connection between the connector 4 and the circuit board 2.

A conventional method of assembling the IC card will now be described. First, the IC packages 3 are connected to both of the surfaces of the circuit board 2 by soldering so that the IC packages 3 are mounted. Then, the connector 4 is electrically and mechanically connected to the circuit board 2 by soldering the connector leads 7a and 7b to both surfaces of either side of the circuit board 2 (see FIG. 11B). A structure constituted by combining the circuit board 2 and the connector 4 is called a "module". Then, the module is so fastened to the main frame 1 that the connector 4 constitutes one of the sides of the frame of the card. At this time, the projecting portion 1c formed on the board supporting portion 1b is inserted into the board fixing hole 2a formed in the central portion of the circuit board 2, followed by deforming of the leading portion of the projecting portion 1c.

Then, the sub-frame 6 is secured to the upper surface of the circuit board 2 by an adhesive agent (omitted from illustration). The sub-frame 6 is secured at the position at which the board supporting portion 1d of the circuit board 2 is located so that the circuit board 2 is interposed between the sub-frame 6 and the board supporting portion 1d. The height of the sub-frame 6 is the same as the distance from the circuit board 2 to the surface panel 8a. Finally, the surface panel 8a and the reverse panel 8b are bonded to the frame portion 1a of the main frame 1, the connector 4 and the sub-frame 6 from their two sides with a sheet adhesive agent (omitted from illustration). As a result, the module composed of the circuit board 2 and the connector 4 is secured to the main frame 1. Further, the surface panel 8a and the reverse panel 8b are supported by the frame portion 1a of the main frame 1, the connector 4 and the sub-frame 6. Therefore, desired mechanical strength can be satisfied.

The conventional IC card has suffered from the problem that the number of IC packages that can be mounted has been unsatisfactorily limited because only one circuit board can be mounted if the IC card is intended to have desired mechanical strength.

SUMMARY OF THE INVENTION

Accordingly, an object of the present invention is to provide an IC card having, at a predetermined interval, circuit boards vertically stacked to form two layers therein while maintaining a predetermined mechanical strength.

In order to achieve the foregoing object, according to one aspect of the present invention, there is provided an IC card having two sides of board supporting portions, which are secured to a frame portion of a main frame and extend into the frame portion, support circuit boards in two stacked layers, and sub-frames as spacers between each of the circuit boards and panels to hold the circuit boards from the board supporting portions. According to another aspect of the present invention, there is provided an IC card further including fixing means for locating and fixing the circuit boards and the sub-frames or the board supporting portion, the fixing means having in one of projecting portions are formed in either of the board supporting portions or both sides of the circuit boards or the sub-frames, receiving holes in the other and board fixing holes in the circuit boards so that the projecting portions are received by the receiving holes via the board fixing holes of the circuit board.

According to another aspect of the present invention, there is provided a method of manufacturing an IC card including two circuit board layers with that an elongated circuit board formed by connecting circuit boards having a length, with which two layers can be formed with a member that can be bent is folded back to maintain a desired distance between the two circuit board layers so that the board supporting portions secured to the frame portion of the main frame and having the desired thickness is held between the two layers so that the circuit board forms the two layers. Then, a connector is electrically and mechanically connected to the two end portions of the folded back elongated circuit board and sub-frames serving as spacers between each of the circuit boards, and the panels are so disposed on the two sides of the board supporting portions as to hold the circuit boards from the board supporting portions. Then, panels are bonded on the two sides to cover the circuit boards.

The present invention includes other aspects.

The IC card according to the present invention has board supporting portions extending in the main frame and the sub-frames so disposed on both sides of the board supporting portions as to hold the circuit boards at desired intervals between the two circuit boards and between each circuit board and the panels. Further, the mechanical strength of the card is maintained. According to the another aspect of the present invention, the projecting portions and receiving holes formed in the board supporting portions or both sides of the circuit boards and the sub-frames and the board fixing holes formed in the circuit boards enable the circuit boards and the sub-frames to be located with respect to the board supporting portions and secured firmly.

The method of manufacturing an IC card according to the present invention has an elongated circuit board formed by connecting circuit boards for two layers to each other with a member that can be bent folded back so that two layers of the circuit board are formed. Therefore, the circuit board for two layers can be formed from one circuit board and the circuit board can easily be located.

DESCRIPTION OF THE PREFERRED EMBODIMENTS

Preferred embodiments of the present invention will now be described with reference to the drawings.

Figure 1A:
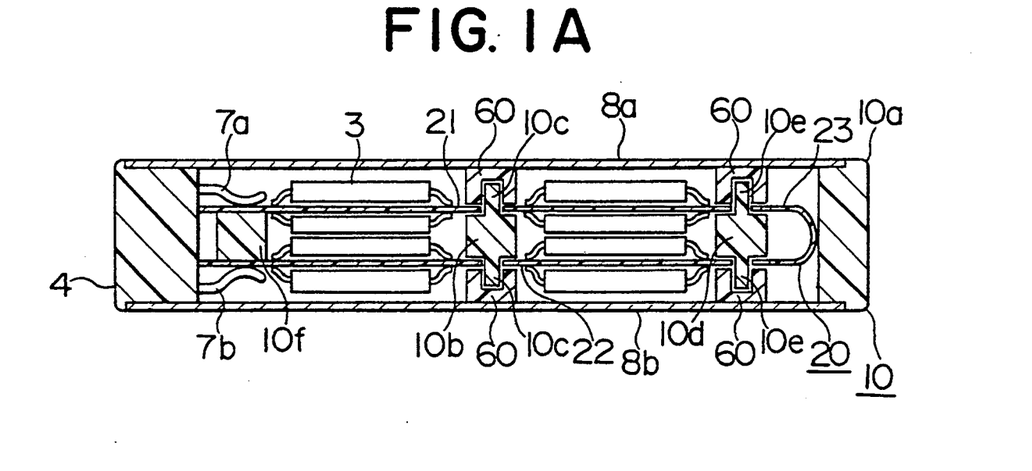
FIG. 1A is a cross sectional view which illustrates an IC card according to an embodiment of the present invention.
Figure 1B:
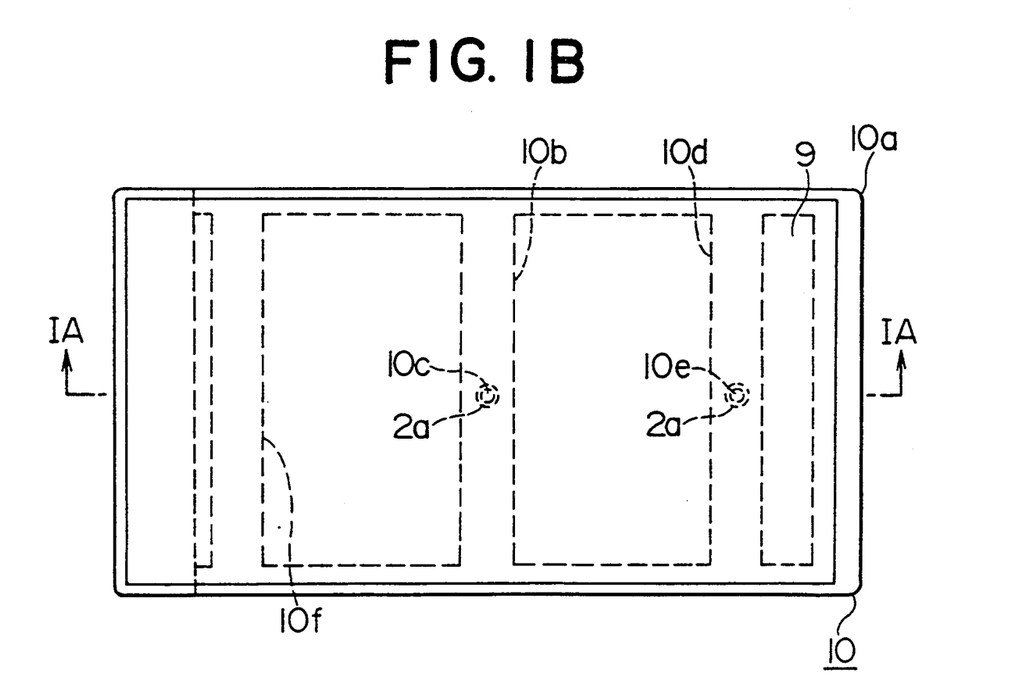
FIG. 1B is a plan view which illustrates the structure of a main frame of the foregoing IC card.
Figure 2A:
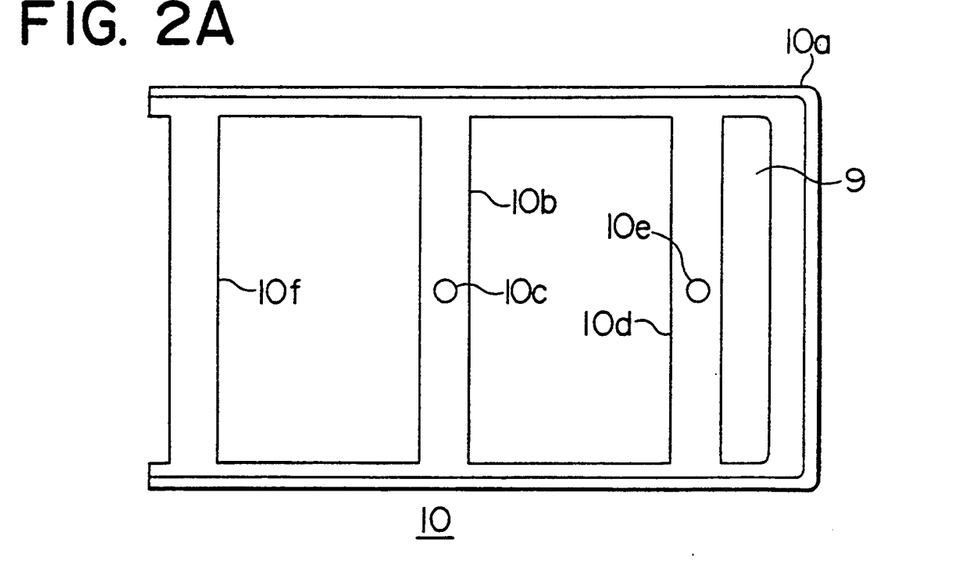
FIG. 2A is a plan view which illustrates the main frame shown in FIGS. 1A and 1B.
Figure 2B:
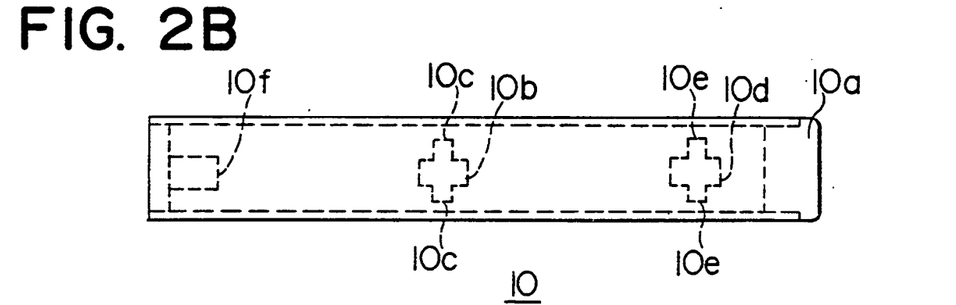
FIG. 2B is a side elevational view which illustrates the foregoing main frame.

FIGS. 1A and 1B illustrate an IC card according to an embodiment of the present invention. FIG. 1B is a plan view which illustrates the structure of a main frame. FIG. 1A is a cross sectional view taken along line IA—IA of FIG. 1B. The same reference numerals as those of the conventional structure represent the same or similar elements. Reference numeral 10 represents a main frame made of resin, 20 represents an elongated circuit board folded back to form two layers in the card and 60 represents a sub-frame. FIGS. 2A and 2B illustrate the main frame 10 shown in FIGS. 1A and 1B. FIG. 2A is a plan view and FIG. 2B is a side elevational view. The main frame 10 comprises a U-shaped frame 10a and three board supporting portions 10b, 10d and 10f within the frame portion 10a, the three board supporting portions 10b, 10d and 10f being respectively integral with the main frame 10 project in opposite directions from. The three board supporting portions 10b, 10d and 10f respectively are located at the central portion of the frame potion 10a in a direction of the height of the frame portion 10a. Further, projecting portions 10c and 10e respectively project in opposite directions from the board supporting portions 10b and 10d.

The elongated circuit board 20 is a unitary elongated circuit board of two circuit board portions 21 and 22 with a bending portion 23 which is made of flexible material that can be bent. Function parts, for example, IC packages 3 are mounted on opposite sides of each of the circuit board portions 21 and 22. Further, board fixing holes 2a, as shown in FIG. 1, in the circuit board 20 engage the board supporting portions 10b and 10d when the circuit board 20 is accommodated in the main frame 10. The board fixing holes 2a receive the projecting portions 10c and 10e of the board supporting portions 10b and 10d (see FIG. 4). It should be noted that the circuit board portions 21 and 22 may be electrically connected by means of a circuit pattern (omitted from illustration) in the bending portion 23. The electrical connection between the two sides of the circuit board is established by, for example, a through hole (omitted from illustration).

Figure 3A:
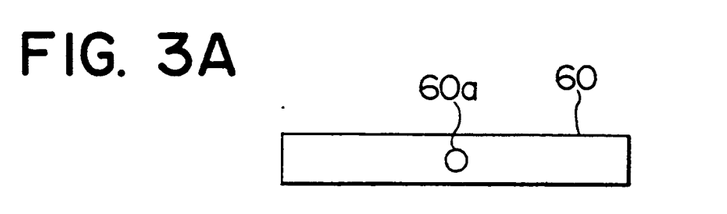
FIG. 3A is a plan view which illustrates the sub-frame shown in FIGS. 1A and 1B.
Figure 3B:
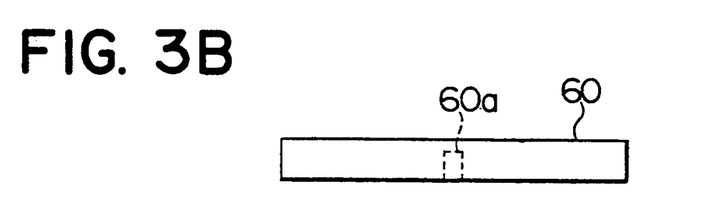
FIG. 3B is a side elevational view which illustrates the foregoing sub-frame.

Sub-frames 60 serve as spacers between the circuit board portions 21 and 22 and the panels 8a and 8b. The sub-frames 60 are shown in FIGS. 3A and 3B which are a plan view and a side elevational view, respectively. Each of the sub-frames 60 has a receiving hole 60a. The receiving holes 60a are, as shown in FIG. 1A, holes for receiving the projecting portions 10c and 10e of the board supporting portions 10b and 10d that penetrate the board fixing holes 2a of the circuit board portions 21 and 22. A fixing means includes the foregoing projecting portions 10c and 10e, the receiving holes 60a, and the board fixing holes 2a.

Figure 4:
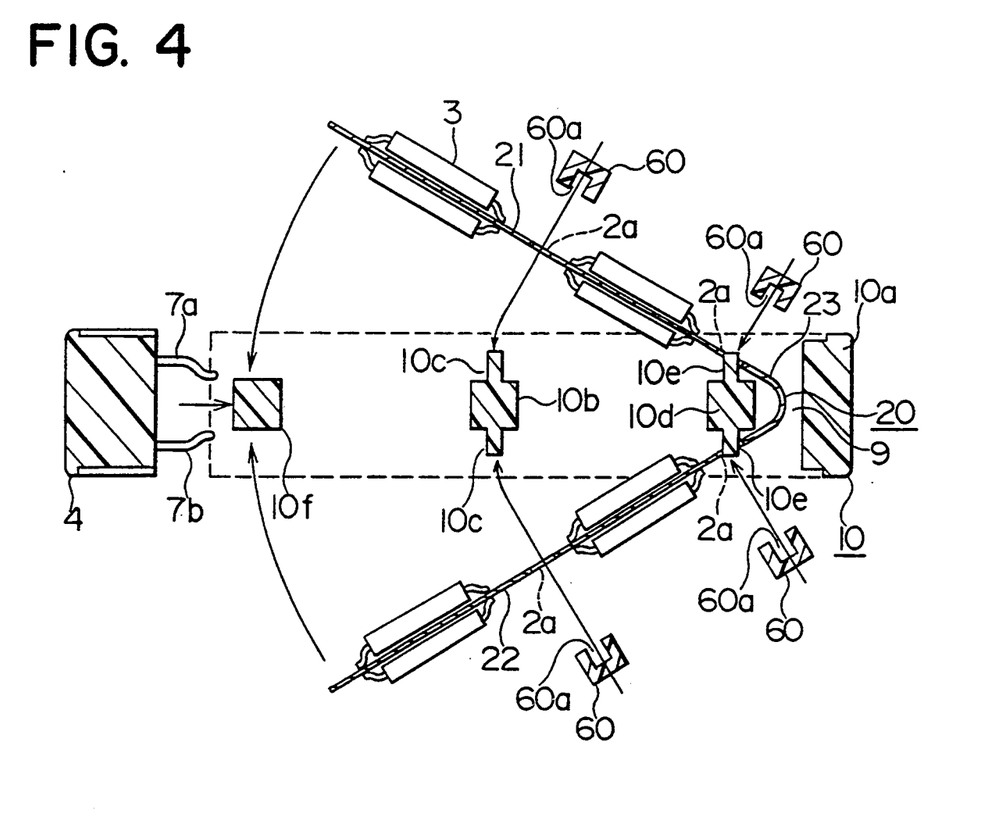
FIG. 4 is an exploded view which illustrates an embodiment of a method of manufacturing an IC card according to the present invention.

FIG. 4 illustrates an embodiment of a method of manufacturing the IC card according to the present invention. The structure of the IC card will now be described in accordance with the sequential order of the manufacturing method. First, the elongated circuit board 20 in a flat state in which the IC packages 3 are mounted on the two sides of each of the circuit board portion 21 and 22 is inserted into a gap 9 formed between the frame portion 10a of the main frame 10 and the board supporting portion 10d until the bending portion 23 reaches the gap 9, followed by folding back the circuit board 20 at the bending portion 23 (a circuit-board bending process). Then, the upward and downward projections 10c and 10e of the board supporting portions 10b and 10d are respectively inserted into the board fixing holes 2a of the circuit board portions 21 and 22 of the bent elongated circuit board 20 so that the elongated circuit board 20 is positioned (a circuit board position process). The positioning process is performed in the following sequential order: the upper projecting portion 10c of the board supporting portion 10b, the upper projecting portion 10e of the board supporting portion 10d, the lower projecting portion 10c of the board supporting portion 10b and the lower projecting portion 10e of the board supporting portion 10d.

Then, the connector 4 is fastened to the main frame 10 (a connector fastening process), the connector 4 being fastened as designated by an arrow of FIG. 4 so that the connector leads 7a and 7b hold the circuit board portions 21, 22 and the board supporting portion 10f at their opposite sides. The connector leads 7a and 7b are, by soldering, secured to the end portions of the circuit board portions 21 and 22, as shown in FIG. 1A. As a result, the elongated circuit board 20, which is folded over, is brought into a state where it is secured to the main frame 10. Then, the sub-frames 60 are fastened to the two upward and two downward projecting portions 10c and 10e penetrating the board fixing holes 2a of the circuit board portions 21 and 22 so that the projecting portions 10c and 10e are received by the receiving holes 60a, the sub-frames 60 being bonded with an adhesive agent (omitted from illustration). Finally the surface panel 8a and the reverse panel 8b are bonded to the frame portion 10a of the main frame 10, the connector 4 and the sub-frames 60 with, for example, a sheet adhesive (omitted from illustration). Thus, the IC card is manufactured (a panel fastening process).

Figure 5:
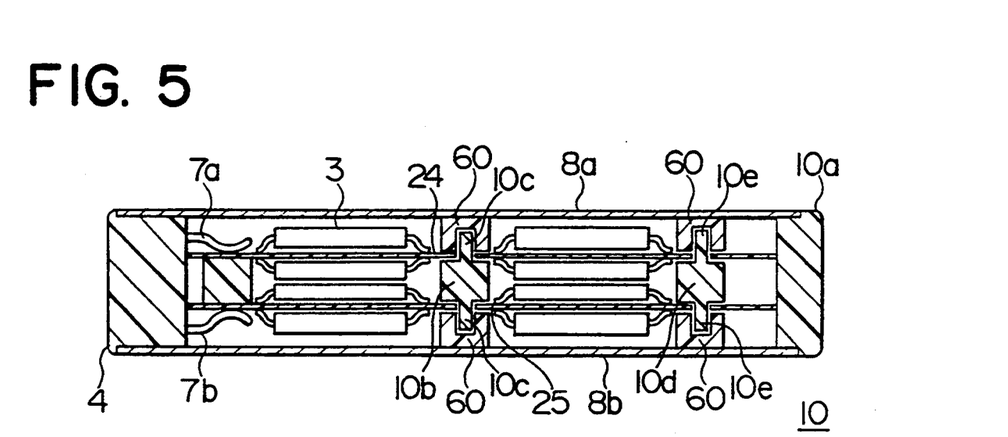
FIG. 5 is a side elevational view which illustrates an IC card having a different structure from the IC card shown in FIGS. 1A and 1B.

By controlling the thickness of each of the board supporting portions 10b, 10d and 10f on the inside of the frame portion 10a of the main frame 10 and those of the sub-frames 60 disposed on the board supporting portions 10b, 10d and 10f to hold the circuit board to the desired thicknesses, the IC card manufactured as described above has a distance between the two circuit board portions 21 and 22 and that between the two circuit board portions 21, 22 and the panels 8a and 8b at a desired interval. Since the interval between the circuit board portions and between the circuit board portions and the panels can be determined arbitrarily by changing the height of the board supporting portions and that of the sub-frame, measures against heat radiation from the IC package and against radiation noise can easily be taken. Further, the board supporting portions 10b, 10d and 10f and the sub-frame 60 enable the card to have the required mechanical strength. If the manufacturing method is not considered, the IC card according to this embodiment may be composed of two independent circuit boards 24 and 25 as shown in FIG. 5 to obtain a similar effect.

When the IC card including a circuit substrate formed into a two-layer structure as described above is manufactured in the foregoing manner with the elongated circuit board having a sufficient length for two circuit boards bent to hold the board supporting portions, the number of parts can be decreased, the circuit board can easily be located with respect to the main frame and the IC can can easily be manufactured. Further, the foregoing manufacturing method causes the module composed of the connector 4 and the elongated circuit board 20 to be secured to the main frame 10 when the connector is fastened in the connector fastening processes. Therefore, the ensuing process can easily be performed.

Figure 6:
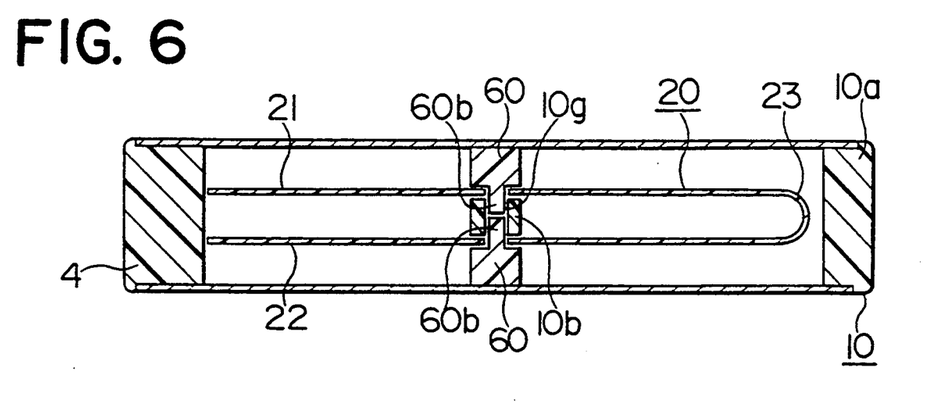
FIG. 6 is a schematic cross sectional view which illustrates an IC card according to a second embodiment of the present invention.
Figure 9A:
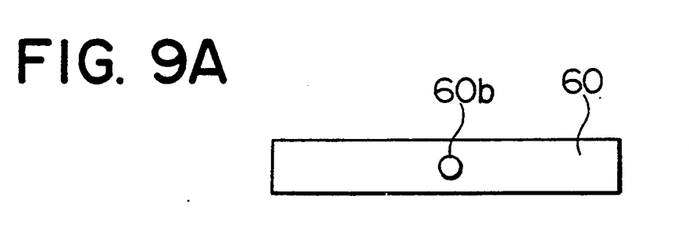
FIG. 9A is a plan view which illustrates the sub-frame shown in FIG. 6.
Figure 9B:
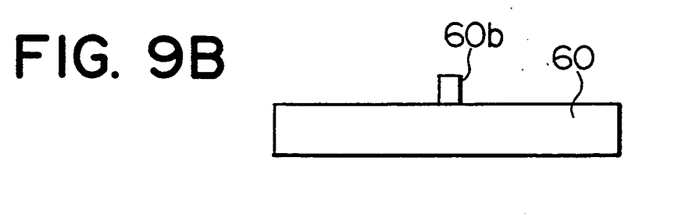
FIG. 9B is a side elevational view which illustrates the foregoing sub-frame.

Although the foregoing embodiment has the projecting portions 10c and 10e on the board supporting portions 10b and 10d, the projecting portions may be on the sub-frames 60. FIG. 6 is a schematic cross sectional view which illustrates an IC card according to a second embodiment of the present invention in which projecting portions 60b are on the sub-frame 60 and a receiving hole 10g penetrates the board supporting portion 10b. FIGS. 9A and 9B illustrate the sub-frame 60 shown in FIG. 6, where FIG. 9A is a plan view and FIG. 9B is a side elevational view. The foregoing structure, of course, enables a similar effect to be obtained.

Figure 7:
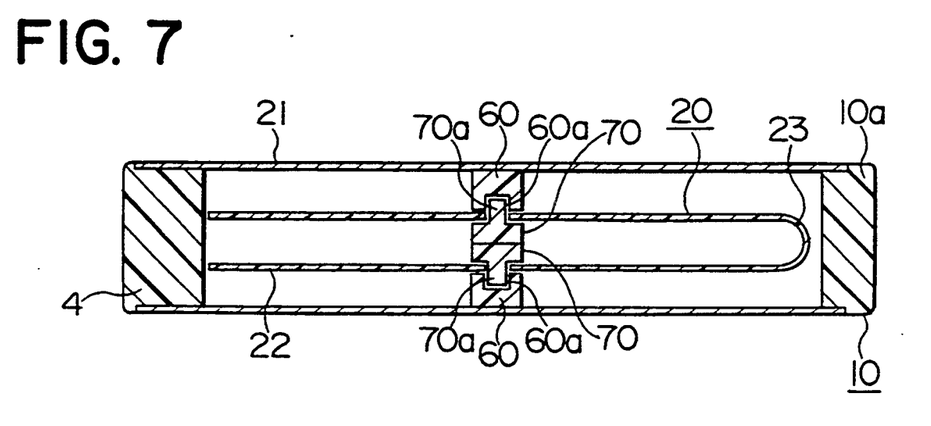
FIG. 7 is a schematic cross sectional view which illustrates an IC card according to a third embodiment of the present invention.

FIG. 7 is a schematic cross sectional view which illustrates a third embodiment of the present invention in which board supporting portions are formed separately from the main frame. This embodiment has an arrangement that two board supporting portions 70 each having one-half the height of those according to each of the foregoing embodiments face in opposite directions so that projecting portions 70a of the two board supporting portions 70 penetrate board fixing holes in the two circuit board portions 21 and 22 of the circuit board 20. Further, sub-frames 60 are so bonded that the projecting portions 70a penetrating the circuit board 20 are received by receiving holes 60a. A method of manufacturing the IC card according to this embodiment will now be described. First, the projecting portions 70a of the two board supporting portions 70 are inserted into the corresponding board fixing holes of the circuit board 20 in a flat state (a state before the circuit board 20 is bent). Then, the sub-frames 60 are bonded on the opposite sides of the circuit board 20 with the projecting portions 70a in the receiving holes 60a. Then, the elongated circuit board 20 is so folded back that the two board supporting portions 70 are bonded to face in the opposite directions. Then, a connector 4 is fastened to the elongated circuit board 20 to which the board supporting portions 70 and the sub-frames 60 are fastened and which are folded back so that a module is formed. The foregoing module is secured to a frame portion 10a. At this time, the two end portions of the board supporting portions 70 and/or the sub-frames 60 are bonded to the frame portion 10a with an adhesive agent (omitted from illustration). Finally, the panels are fastened on two sides.

Figure 8:
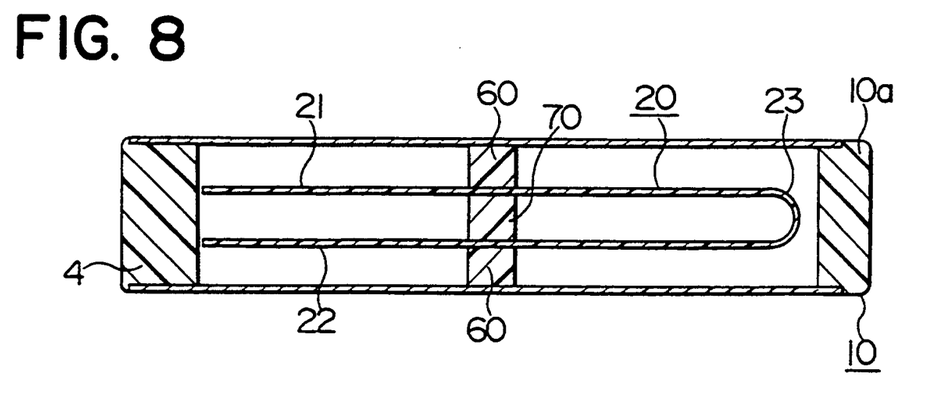
FIG. 8 is a schematic cross sectional view which illustrates an IC card according to a fourth embodiment of the present invention.

FIG. 8 is a schematic cross sectional view which illustrates an IC card according to another embodiment in which a board supporting portion is separate from the main frame. The IC card according to this embodiment employs a board supporting portion 70 and a sub-frame 60 from which the projections and receiving holes are omitted. Therefore, the circuit board 20 has no board fixing hole.

A similar effect can be obtained from arrangements according to the third and fourth embodiments in which the board supporting portions interposed between the two layers of the circuit board are separate from the frame portion of the main frame and are fixed to the frame portion during the assembly process.

Also in the case of the first and second embodiments in which the main frame has internal board supporting portions, a structure may be employed in which the projecting portions and the receiving holes are omitted from the board supporting portions and the sub-frames.

As described above, the an IC card according to the present invention has two sides of a board supporting portions secured to a frame portion of a main frame supporting the circuit board having two stacked layers. Further, sub-frames serving as spacers between each of the circuit boards and the panel on both sides of the board supporting portions hold the circuit board from the board supporting portions. Therefore, the distance between the two circuit boards and the distance between each circuit board and the panels can be maintained at desired intervals in accordance with the thicknesses of the board supporting portions and of the sub-frame so that the mechanical strength of the card can be ensured. Further, the projecting portions are formed on one of the board supporting portions or the sub-frames and the receiving holes are formed in the other of those elements. In addition, the board fixing holes in the circuit board are received by the receiving holes so that the circuit board and the sub-frame are located and secured to the board supporting portions.

A method of manufacturing an IC card according to the present invention has an elongated circuit board formed by connecting a circuit boards having a length so that two layers can be formed with a member that can be bent folded back to maintain a desired distance between the two circuit board layers so that the board supporting portions secured to the frame portion of the main frame and having the desired thickness are held between the two layers. Therefore, the number of parts can be decreased, the circuit board can easily be located with respect to the main frame and manufacturing can easily be performed. By interposing the board supporting portions between the two layers of the circuit board that are separate from the frame portion of the main frame and by securing the board supporting portions to the frame portion during the assembling process, the number of parts can be decreased in comparison to the arrangement in which two circuit boards are used. Further, a module composed of the circuit board forming the two layers, the connector, the board supporting portions and the sub-frame can easily be formed. Therefore, the IC card comprising the circuit board forming the two layers can easily be manufactured.

What is claimed is:

1. An IC card comprising:
    two circuit boards stacked opposite each other with a predetermined spacing and electronic component parts mounted on each of the circuit boards;
    a main frame including a U-shaped frame portion having an open end and surrounding three sides of said two circuit boards and at least one board supporting portion secured to said frame portion and extending between said two circuit boards to maintain the spacing between said circuit boards;
    a connector disposed at the open end of said main frame, said connector being electrically and mechanically connected to both of said circuit boards;
    two opposed panels mounted on said main frame and connector covering said circuit boards; and
    sub-frames secured to said two circuit boards at said board supporting portions so that said circuit boards are held at a spacing from said panels.

2. The IC card as claimed in claim 1 comprising fixing means for locating said sub-frames on opposite sides of said board supporting portions and said circuit boards from said board supporting portions.

3. The IC card as claimed in claim 2 wherein said fixing means includes projecting portions on one of said board supporting portions and said sub-frames, receiving holes in the other of said board supporting portions, and sub-frames receiving said projecting portions and board fixing holes in said two circuit boards penetrated by said projecting portions.

4. The IC card as claimed in claim 1 wherein said two circuit boards are unitary and include a folded connecting portion.

5. A method of manufacturing an IC card comprising:
    bending a circuit board to form two opposed circuit board layers, each circuit board layer having electronic component parts mounted thereon;
    interposing board supporting portions of a main frame between said two circuit board layers to maintain a distance between said two layers;
    locating said circuit board with respect to said board supporting portions of said main frame;
    fastening a connector between two end portions of said main frame and said two circuit board layers to electrically and mechanically connect said circuit board to said main frame;
    fastening sub-frames for maintaining a desired distance between panels of said IC card and said circuit board layers to hold said circuit board between said board supporting portions; and
    securing surface panels to said main frame, said connector, and said sub-frames to cover said circuit board layers.

6. A method of manufacturing an IC card comprising:
    fastening at least one pair of board supporting portions to predetermined positions on an elongated circuit board including a bent member;
    fastening sub-frames to said elongated circuit board at positions opposite said board support portions;
    folding said elongated circuit board so that said pair of board supporting portions face in opposite directions;
    fastening a connector to two end portions of said folded elongated circuit board to form a module;
    securing said module to a frame portion;
    securing end portions of one of said board supporting portions and said sub-frames to said frame portion; and
    securing an obverse panel and a reverse panel to a main frame, said connector, and said sub-frame to cover said module.

* * * * *